US008808564B2

(12) United States Patent
Rogers et al.

(10) Patent No.: US 8,808,564 B2
(45) Date of Patent: Aug. 19, 2014

(54) METHOD AND APPARATUS FOR SELECTIVE NITRIDATION PROCESS

(71) Applicant: Applied Materials, Inc., Santa Clara, CA (US)

(72) Inventors: Matthew S. Rogers, Mountain View, CA (US); Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 13/672,469

(22) Filed: Nov. 8, 2012

(65) Prior Publication Data

US 2013/0122713 A1    May 16, 2013

Related U.S. Application Data

(60) Provisional application No. 61/560,148, filed on Nov. 15, 2011.

(51) Int. Cl.
*B44C 1/22*    (2006.01)
*C03C 15/00*    (2006.01)
*C03C 25/68*    (2006.01)
*C23F 1/00*    (2006.01)

(52) U.S. Cl.
USPC ............................. 216/79; 216/37; 438/743

(58) Field of Classification Search
CPC .......... H01L 2224/11901; H01L 2224/11831; H01L 2224/1182; H01L 21/3144; H01L 21/0234
USPC ...................... 216/79, 37; 438/743
See application file for complete search history.

(56) References Cited

U.S. PATENT DOCUMENTS

| 7,109,559 B2 | 9/2006 | Khare et al. |
| 7,291,568 B2 * | 11/2007 | Burnham et al. ............ 438/775 |
| 2002/0042193 A1 * | 4/2002 | Noguchi et al. ............ 438/618 |
| 2009/0111280 A1 * | 4/2009 | Kao et al. ................... 438/761 |
| 2009/0320677 A1 * | 12/2009 | Shajii et al. .................... 95/17 |
| 2011/0256708 A1 | 10/2011 | Choi et al. |

FOREIGN PATENT DOCUMENTS

| JP | H0547720 | 2/1993 |
| JP | H0697111 | 4/1994 |
| KR | 10-0458851 | 11/2004 |
| KR | 10-0799129 | 1/2008 |

OTHER PUBLICATIONS

International Search Report and Written Opinion of the International Searching Authority mailed Mar. 29, 2013 in PCT/US/2064206.

* cited by examiner

*Primary Examiner* — Roberts Culbert
(74) *Attorney, Agent, or Firm* — Patterson & Sheridan, LLP

(57) ABSTRACT

Embodiments described herein generally relate to methods for manufacturing flash memory devices. In one embodiment, a method for removing native oxides from a substrate is provided. The method includes transferring a substrate having an oxide layer disposed thereon into a first processing chamber, exposing the substrate to a plasma generated from a cleaning gas mixture, wherein the cleaning gas mixture comprises a hydrogen-containing gas and a fluorine-containing gas, heating the substrate to a temperature sufficient to remove the oxide layer from the substrate, transferring the substrate from the first processing chamber to a second processing chamber without breaking vacuum, and flowing a plasma containing substantially nitrogen-containing radicals into the second processing chamber to expose the substrate to nitrogen containing radicals.

20 Claims, 7 Drawing Sheets

METHOD AND APPARATUS FOR SELECTIVE NITRIDATION PROCESS

CROSS-REFERENCE TO RELATED APPLICATIONS

This application claims benefit of U.S. provisional patent application Ser. No. 61/560,148, filed Nov. 15, 2011, which is herein incorporated by reference.

BACKGROUND

1. Field of the Invention

Embodiments of the present invention generally relate to manufacturing semiconductor devices. More specifically, embodiments described herein relate to manufacture of floating gate NAND memory devices and other gate transistors using an improved plasma applicator and process.

2. Description of the Related Art

Flash memory, such as NAND flash memory devices, is a commonly used type of non-volatile memory in widespread use for mass storage applications. The NAND flash memory devices typically have a stacked type gate structure in which a tunnel oxide (TO), a floating gate (FG), an inter-poly dielectric (IPD), and a control gate (CG) are sequentially stacked on a semiconductor substrate. The floating gate, the tunnel oxide, and the underlying portion of the substrate generally form a cell (or memory unit) of the NAND flash memory device. A shallow trench isolation (STI) region is disposed in the substrate between each cell adjacent to the tunnel oxide and the floating gate to separate the cell from adjacent cells. During writing of the NAND flash memory devices, a positive voltage is applied to the control gate which draws electrons from the substrate into the floating gate. For erasing data of the NAND flash memory devices, a positive voltage is applied to the substrate to discharge electrons from the floating gate and through the tunnel oxide. The flow of electrons is sensed by a sensing circuitry and results in the returns of "0" or "1" as current indicators. The amount of electrons in the floating gate and "0" or "1" characteristics form the basis for storing data in the NAND flash memory devices.

The floating gate is typically isolated from the semiconductor substrate by the tunnel oxide and from the control gate by the inter-poly dielectric, which prevents the leakage of electrons between, for example, the substrate and the floating gate or the floating gate and the control gate. To enable continued physical scaling of the NAND flash memory device, a nitridation process has been used by the industry to incorporate nitrogen into the surface of the floating gate to improve the reliability of the tunnel oxide or to suppress dopant diffusion out of the floating gate. The surface nitridation of the tunnel oxide is also desirable for minimizing the flat-band voltage (Vfb) shift and mobility degradation. The percentage of the nitrogen at the floating gate and the tunnel oxide interface is critical to improve the NAND flash program window. However, the nitridation process also undesirably incorporates nitrogen into shallow trench isolation regions. Nitrogen incorporated in the shallow trench isolation region between neighboring floating gate structures forms a charge leakage path which can negatively impact final device performance.

Therefore, there is a need for improved methods and an apparatus for nitridation of stacks of materials without having the above-mentioned issues.

SUMMARY OF THE INVENTION

Embodiments described herein generally relate to methods for manufacturing flash or DRAM memory devices. In one embodiment, a method for removing native oxides from a substrate is provided. The method includes transferring a substrate having an oxide layer disposed thereon into a first processing chamber, exposing the substrate to a plasma generated from a cleaning gas mixture, wherein the cleaning gas mixture comprises a hydrogen-containing gas, heating the substrate to a temperature sufficient to remove the oxide layer from the substrate, transferring the substrate from the first processing chamber to a second processing chamber without breaking vacuum, and flowing a plasma containing substantially nitrogen-containing radicals into the second processing chamber to expose the substrate to nitrogen containing radicals.

In another embodiment, a method for removing native oxides from a substrate is provided. The method includes transferring a substrate having an oxide layer formed thereon into a processing chamber, exposing the substrate to a plasma generated from a cleaning gas mixture to remove the oxide layer from the substrate, wherein the cleaning gas mixture comprises a hydrogen-containing gas, and exposing the substrate to a plasma containing substantially nitrogen-containing radicals and/or energetically excited neutral species to form a nitride layer on the substrate.

In yet another embodiment, a method for removing native oxides from a substrate is provided. The method includes transferring a substrate having an oxide layer disposed on a gate electrode or a source or drain regions formed in the substrate into a first processing chamber, exposing the oxide layer to a plasma generated from a cleaning gas mixture, wherein the cleaning gas mixture comprises an ammonia ($NH_3$) gas and a nitrogen trifluoride ($NF_3$) gas, heating the substrate to a temperature sufficient to remove the oxide layer from the substrate, transferring the substrate from the first processing chamber to a second processing chamber without breaking vacuum, and exposing the substrate to a plasma containing substantially nitrogen-containing radicals to form a nitride layer on the exposed surface of the gate electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The invention describes an apparatus and method for incorporating radicals of a plasma into a substrate or a material on a semiconductor substrate using a remote plasma source. In various embodiments of the present invention, the substrate or the material (e.g., a conductive material, such as silicon, polysilicon, metals, or the like) on the semiconductor substrate may be subjected to a pre-clean process to remove native oxides or contaminants from the surface thereof prior to the subsequent radical treatment process, such as a selective plasma nitridation process. The cleaned substrate provides a receptive surface for incorporation of radicals (e.g., nitrogen radicals), thus improving the radical dose profile. The pre-clean process may be a wet clean process using a HF-last process, or a dry clean process such as a plasma etching process. The substrate or the material on the semiconductor substrate may be transferred, directly or indirectly, between a cleaning chamber performing the pre-clean process and a thermal processing chamber performing the radical treatment process without breaking vacuum (oxygen-free environment). The cleaning chamber and the thermal processing chamber may be integrated into a variety of multi-processing platforms such as, for example, the Producer® GT, Radiance Centura®, Vantage®, or Endure® that are commercially available from Applied Materials Inc. Such a processing platform is capable of performing several processing processes without breaking vacuum. In certain embodiments, multiple chamber pairs including the cleaning chamber and the thermal processing chamber may be included on the processing platform to improve throughput.

While the present invention is not to be limited to a particular substrate or device, the apparatus and methods described can be used for the manufacture of semiconductor devices and structures suitable for narrow pitch applications. As used herein, narrow pitch applications include half-pitches of 32 nm or less (e.g., device nodes of 32 nm or less). The term "pitch" as used herein refers to a measure between the parallel structures or the adjacent structures of the semiconductor device. The pitch may be measured from side to side of the same side of the adjacent or substantially parallel structures. The semiconductor devices and structures may be utilized in applications having greater pitches as well. The semiconductor devices may be, for example, NAND or NOR flash memory, or other suitable devices.

Exemplary NAND Flash Memory Device

Figure 1:
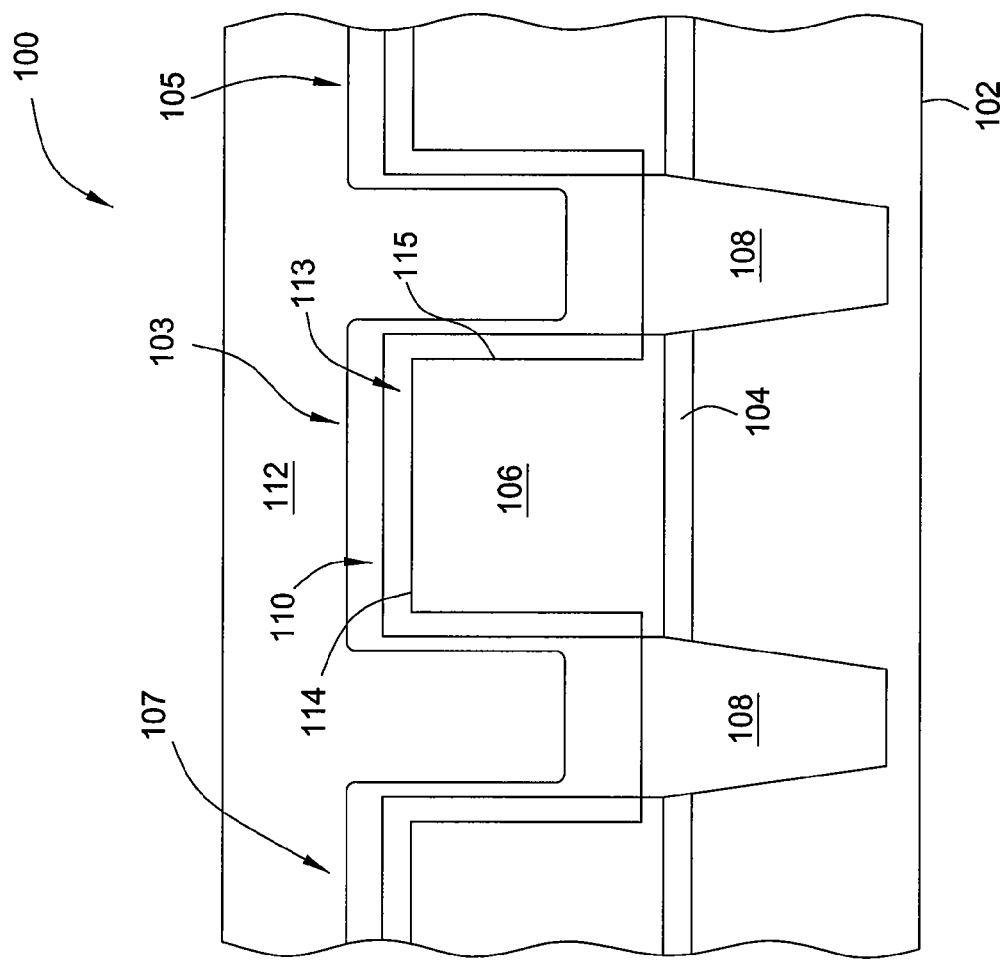
FIG. 1 illustrates a schematic cross-sectional view of an exemplary semiconductor device that can be made with a method and an apparatus according to one embodiment of the invention.

FIG. 1 illustrates a schematic cross-sectional view of an exemplary semiconductor device, such as a NAND flash memory device 100, that can be made with the apparatus of the present invention. The memory device 100 generally includes a substrate 102 having a tunnel oxide layer 104 disposed thereon. A floating gate 106 which serves as a gate transistor is disposed on the tunnel oxide layer 104. The floating gate 106, the tunnel oxide layer 104, and the underlying portion of the substrate 102 form a cell 103 (or memory unit) of the memory device 100. Each cell 103 of the memory device 100 may be separated, for example, by a shallow trench isolation (STI) region 108 which is disposed in the substrate 102 between each cell 103 (e.g., adjacent to the tunnel oxide layer 104 and floating gate 106, where the STI region 108 separates the cell 103 from adjacent cells 105 and 107). The memory device 100 further includes a control gate layer 112 and an inter-poly dielectric (IPD) layer 110 disposed between the floating gate 106 and the control gate layer 112. The IPD layer 110 separates the floating gate 106 from the control gate layer 112.

The substrate 102 may include a suitable material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 102 comprises silicon.

The tunnel oxide layer 104 may include silicon and oxygen, such as silicon oxide ($SiO_2$), silicon oxynitride (SiON), or high-k dielectric materials, such as aluminum-(Al), hafnium-(Hf), or lanthanum-(La), zirconium-(Zr) based oxides or oxynitrides, or silicon nitrides ($Si_xN_y$), in single or layered structures (e.g., $SiO_2$/high-k/$SiO_2$), or the like. The tunnel oxide layer 104 may have any suitable thickness, for example, between about 5 nm to about 12 nm. The tunnel oxide layer 104 may have a width, within each cell, substantially equivalent to the width of a base of the floating gate 106. The STI region 108 may include silicon and oxygen, such as silicon oxide ($SiO_2$), silicon oxynitride (SiON), or the like.

The floating gate 106 typically includes a conductive material, such as silicon, polysilicon, metals, or the like. The floating gate 106 has a configuration suitable to facilitate disposing portions of the control gate layer 112 between adjacent cells (e.g., between cells 103, 105, and 107). As such, the floating gate may be formed in an inverted "T" shape. As used herein, the term inverted "T" refers generally to the geometry of the structure wherein an upper portion of the floating gate 106 is relieved with respect to a base of the floating gate 106. Such relief provides room for the IPD layer 110 to be formed over the floating gate 106 without completely filling the gap between adjacent floating gates 106, thereby allowing a portion of the control gate layer 112 to be disposed between adjacent floating gates 106.

The IPD layer 110 may include any suitable single or multi-layer dielectric materials. An exemplary single layer IPD may include $SiO_2$, SiON, or a high-k dielectric material as discussed above with respect to tunnel oxide layer 104, or the like. An exemplary multi-layer IPD may be a multi-layer "ONO" structure (not shown) including a first oxide layer, a nitride layer, and a second oxide layer. The first and second oxide layers typically include silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer IPD layer comprising $SiO_2$/high-k/$SiO_2$ (such as, $SiO_2/Al_2O_3/SiO_2$) can also be used as the IPD layer 110. The IPD layer 110 may be deposited to a thickness of between about 10 nm to about 15 nm.

The control gate layer 112 may be deposited atop the IPD layer 110 to form a control gate. The control gate layer 112 typically comprises a conductive material, such as polysilicon, metal, or the like. The inverted T shape of the floating gate 106 enables a larger surface area, located between adjacent floating gates (for example, those of cells 103 and 105), for the control gate late 112. The increased surface area of the control gate layer 112 may advantageously improve capacitive coupling between a sidewall of the floating gate 106 and the control gate, and may reduce parasitic capacitance between adjacent floating gates, floating gate interference, noise, or the like.

Optionally, prior to IPD deposition, a dielectric layer 113 may be conformally formed on the exposed surface of the floating gate 106. Specifically, the dielectric layer 113 is selectively formed mainly on the exposed surface of the floating gate 106, with little or no formation of the dielectric layer 113 on the STI region 108 or any other dielectric films under the identical plasma conditions (will be discussed in detail below). With the dielectric layer 113 selectively formed mainly on floating gate 106, the reliability of the tunnel oxide and/or suppression of dopant diffusion out of the floating gate 106 are improved while enabling scaling of the IPD film stack thickness.

The dielectric layer 113 may be a nitride layer such as silicon nitride or silicon oxynitride. The nitride layer may be formed by exposing the field surface 114 and sidewall 115 of the floating gate 106 to nitrogen containing radicals. Nitrogen containing radicals, such as N, NH, NO, $NH_2$, or $NH_3$, may be created with the aid of some excitation, for instance, a plasma excitation, a photo excitation, an electron-beam excitation, or intense heat. Nitridation process may be performed by thermal means alone, by plasma means alone, or by a combination of the two. In one embodiment, the surfaces of the floating gate 106 are exposed to nitrogen containing radicals using a selective plasma nitridation process. The nitrogen containing radicals will react preferentially with the surface of the floating gate 106 (formed of silicon or polysilicon, for example) during the selective plasma nitridation process, rather than the surface of the STI region 108 (formed of silicon oxide, for example) due to lower Si—Si bond-breaking energies (222 kJ/mol) compared to Si—O bond-breaking energies (452 kJ/mol). As radicals are not reactive enough to break Si—O bond, the selective plasma nitridation process forms nitrides of silicon faster than nitrides of silicon oxide, resulting in a significantly greater concentration of nitrogen-containing material, i.e., dielectric layer 113 formed of, for example, Si—N bonds, at the field surface 114 and sidewall 115 of the floating gate 106 as opposed to STI region 108 between the adjacent floating gates 106. Since the nitrogen-containing material or dielectric layer 113 is not present in significant amounts at STI region 108, the undesired charge leakage path between neighboring floating gate structures does not occur.

Radicals are preferred because ions have high chemical activity compared to radicals and compared to the bond energies listed above (1st ionization energy of N2=1402 kJ/mol; atomization energy of N2=473 kJ/mol), so ions do not achieve the selectivity of radicals. Selectivity, defined as concentration of nitrogen in silicon divided by concentration of nitrogen in oxide after a given deposition process, may be between about 10:1 and about 100:1, such as between about 20:1 and about 70:1, for example about 40:1. Greater exposure time may improve the selectivity.

High radical density versus ion density may be achieved by a high pressure plasma process using, for example, a pressure between about 0.3 Torr and 20 Torr, for example, about 5 Torr or above. The high pressure encourages ions to recombine with electrons quickly, leaving neutral radical species and inactive species. In some embodiments, a radical gas is formed. In some embodiments, remote plasma may be used to selectively generate radical species by various methods. The remote plasma generator, for example a microwave, RF, or thermal chamber, may be connected to a processing chamber through a delivery pipe. The delivery pipe, as will be described in more detail below with respect to FIGS. 3 and 4, may be a relatively long pathway positioned at an angle relative to the processing chamber to encourage recombination of ionic species along the pathway before reaching the processing region. The radicals flowing through the delivery pipe may flow into the chamber through a showerhead or radical distributor, or through a portal entry in a side wall of the chamber at a flow rate between about 1 slm and about 20 slm, such as between about 5 slm and about 20 slm, for example about 10 slm. Higher pressures and lower flows are believed to promote collisions. Nitrogen radicals may be formed in one embodiment by exposing a nitrogen containing gas, such as nitrogen ($N_2$), nitric oxide (NO), nitrous oxide ($N_2O$), nitrogen dioxide ($NO_2$), ammonia ($NH_3$), hydrazine ($N_2H_4$), or mixtures thereof, optionally with a carrier gas such as helium, to microwave power between about 1-3 kW at a pressure above about 5 Torr. The nitridation process may be performed at a substrate temperature between about 300° C. and about 1200° C., for example between about 800° C. and about 1000° C., which may be increased as the nitridation proceeds to combat surface saturation. Heating may be performed using lamp heating, laser heating, use of a heated substrate support, or by plasma heating.

In certain embodiments, various ion filters, such as electrostatic filters operated at a bias of, for example, about 200V (RF or DC), wire or mesh filters, or magnetic filters, any of which may have a dielectric coating, may be used between the remote plasma source and the processing chamber. In other embodiments, residence time in the remote plasma generator may be modulated using gas flow of reactive species such as nitrogen containing species or gas flow of non-reactive species such as argon or helium. In some embodiments, radical half-life may be extended by using an ion filter with low pressure plasma generation. Low pressure operation may be facilitated by integrating a processing chamber with a remote plasma chamber without using an O-ring to seal the pathway between the two chambers. Uniformity of radical flow into a processing chamber from remote plasma generation chamber may be improved using a shaped connector to provide intimate control of flow patterns.

The invention as described herein contemplates that substantially all ions present in the plasma at the plasma generation (with the radicals) are eliminated prior to coming in contact with the surface of the floating gate 106 (formed of silicon or polysilicon, for example) during the selective plasma nitridation process, rather than the surface of the STI region 108 (formed of silicon oxide, for example). One way positively charged ions are eliminated is by combining with electrons (also present in the plasma at the plasma generation) to return to a non-ionic or charge neutral state. A plasma may be substantially free of the majority of the ions by separating the plasma generation source from the substrate location, e.g., the reaction site, by a distance longer than the lifetime of the ions at a given plasma discharge rate. In this manner, the radicals survive the travel distance to the substrate, but ions do not and instead lose their ionic character and become charge neutral.

Exemplary Remote Plasma System

Figure 2:
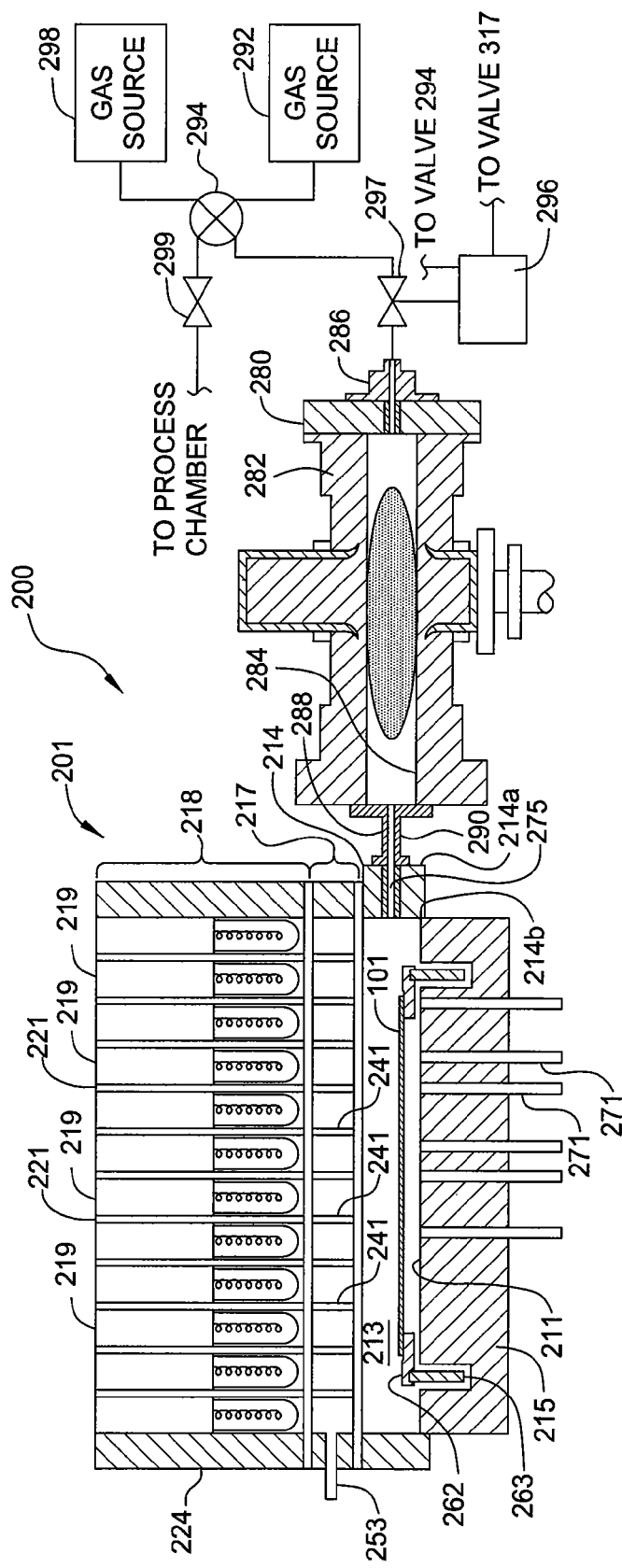
FIG. 2 illustrates a schematic view of a remote plasma system in accordance with one embodiment of the invention.

FIG. 2 illustrates an exemplary remote plasma system 200 may benefit from embodiments of the present invention. Particularly, the remote plasma system 200 may be used to selectively form a nitride layer on a silicon or polysilicon surface of a semiconductor structure, such as a NAND flash memory device 100. The remote plasma system 200 may include a rapid thermal processing (RTP) chamber 201, such as Centura® RTP commercially available from Applied Materials, Inc., located in Santa Clara, Calif. Other types of thermal reactors may be substituted for the RTP apparatus such as, for example, RPN, RPO, Vantage RadiancePlus™ RTP, Vantage RadOX™ RTP, Radiance® RTP, or other similar chambers/reactors available from Applied Materials Inc. of Santa Clara, Calif.

As can be seen in FIG. 2, coupled to the RTP chamber 201 is a plasma applicator 280 used to remotely provide radicals of a plasma to the RTP chamber 201. The plasma applicator 280 generally serves as a remote plasma source where an energetic excitation of gaseous molecules consisting of a plasma of charged ions, radicals, and electrons is performed. The invention recognizes that radicals of a plasma react in a much more desirable manner with silicon or polysilicon material on a substrate, than ions or a mixture of radicals and ions. In that regard, the invention provides an apparatus and a method of eliminating the majority of the ions of the plasma such that only radicals of the plasma react with silicon or polysilicon material on a substrate, thereby obtaining a greater selectivity of processing of silicon or polysilicon material on the substrate.

The RTP chamber 201 generally includes a processing region 213 enclosed by a side wall 214 and a bottom wall 215. The upper portion of side wall 214 may be sealed to a window assembly 217 by "O" rings. A radiant energy light pipe assembly 218 (enclosed by an upper side wall 224) is positioned over and coupled to window assembly 217. Light pipe assembly 218 may include a plurality of tungsten halogen lamps 219 each mounted into light pipes 221 and positioned to adequately cover the entire surface area of wafer or substrate 101. Window assembly 217 may include a plurality of short light pipes 241. A vacuum can be produced in the plurality of light pipes 241 by pumping through a tube 253 connected to one of the light pipes 241 which is in turn connected to the rest of the pipes.

A wafer or substrate 101 containing the NAND flash memory device 100 is supported by a support ring 262 within a processing region 213. Support ring 262 is mounted on a rotatable cylinder 263. By rotating cylinder 263, the support ring 262 and the wafer or substrate 101 are caused to rotate during processing. Bottom wall 215 of RTP chamber 201 may be coated or provided with a reflector 211 for reflecting energy onto the backside of wafer or substrate 101. The RTP chamber 201 may include a plurality of fiber optic probes 271 positioned through the bottom wall 215 of RTP chamber 201 to detect the temperature of the wafer or substrate.

The plasma applicator 280 generally includes a body 282 surrounding a tube 284 where a plasma of ions, radicals, and electrons is generated. The tube 284 may be made of quartz or sapphire. The tube 284 preferably does not form any electrical bias that might attract charged particles, e.g., ions. A gas inlet 286 is disposed at one end of the body 282 and opposes to a gas outlet 288 that is located at the other end of the body 282. The gas outlet 288 is in fluid communication with the RTP chamber 201 through a delivery pipe 290 such that radicals of the plasma generated within the tube 284 are supplied to the processing region 213 of the RTP chamber 201. The gas outlet 288 may have a diameter larger than gas inlet 286 to allow the excited radicals to be efficiently discharged at desired flow rate and to minimize the contact between the radicals and the tube 284. If desired, a separate orifice may be inserted into tube 284 at the gas outlet 288 to reduce the tube's inner diameter. The diameter of the gas outlet 288 (or orifice, if used) can be selected to optimize the pressure differential between the processing region 213 and the plasma applicator 280 for nitridation efficiency.

A gas source 292 of nitrogen-containing gas, including, but not limited to, $N_2$ gas, may couple to a gas inlet 286 via a first input of a three-way valve 294 and a valve 297 used to control the flow rate of gas released from the gas source 292. A second input of the three-way valve 299 may be coupled to another process gas source 298 including, but not limited to, oxygen-containing gas, silicon-containing gas, or inner gas. A flow controller 296 is connected to the three-way valve 294 to switch the valve between its different positions, depending upon which process is to be carried out. The flow controller 296 also functions in a similar fashion to control the three-way valve 294 and the valve 317 to provide an appropriate process gas flow from gas source 298 to the process chamber.

The plasma applicator 280 may be coupled to an energy source (not shown) to provide an excitation energy, such as an energy having a microwave frequency, to the plasma applicator 280 to excite the process gas traveling from the gas source 292 into a plasma. In the case where nitrogen-containing gas, for example, $N_2$, is used, the microwave excitation in plasma applicator 280 produces N* radicals, positively charged ions such as $N^+$ and $N^{2+}$, and electrons in the tube 284. By locating the plasma applicator 280 remotely from the processing region 213 of RTP chamber 201, a plasma source can be selectively generated to limit the composition of the plasma exposed to substrate 101 to predominantly radicals. It has been observed that ions collisions can be further promoted by using an improved delivery pipe 290 such that all or the majority of ions generated by the excitation of the process gas to form a plasma outlive their ionic lifetime and become charge neutral before reaching the processing region 213. In other words, the composition of the plasma that is supplied to the inlet port 275 of the RTP chamber 201 is predominantly radicals.

Figure 3:
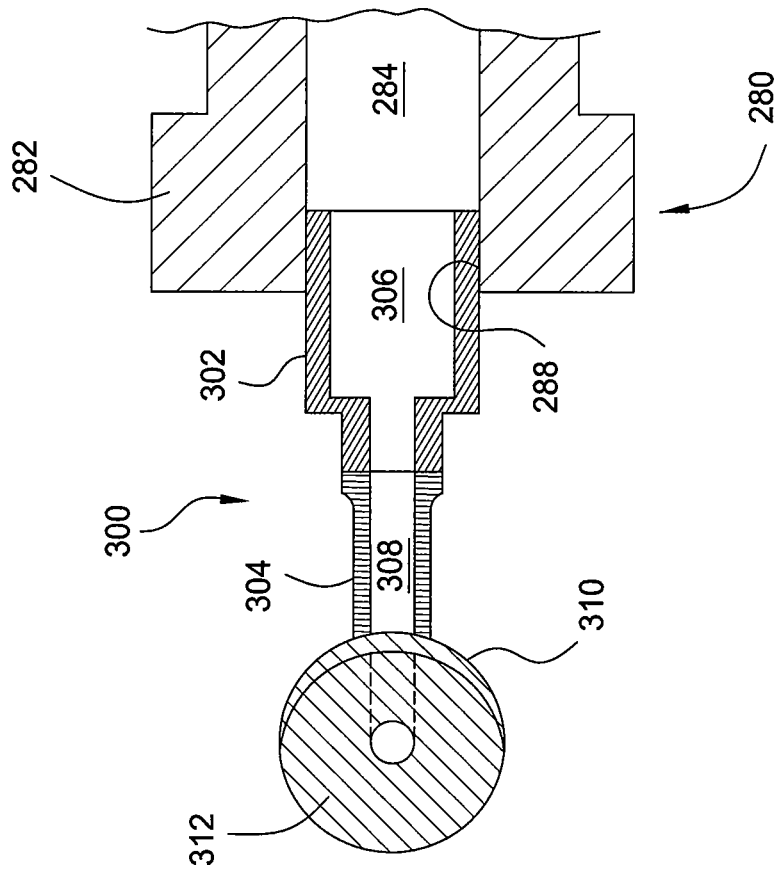
FIG. 3 illustrates a schematic and fragmentary cross-sectional side view of an exemplary delivery pipe for use in supplying radicals of a plasma to an RTP apparatus according to one embodiment of the invention.

FIG. 3 illustrates a schematic and fragmentary cross-sectional side view of an exemplary delivery pipe 300 that may be used in place of the delivery pipe 290 of FIG. 2 according to one embodiment of the present invention. For the purpose of simplicity and clarity of illustration, elements in the drawings have not been drawn to scale. The delivery pipe 300 generally includes a mounting sleeve 302 and an inlet member 304 connecting to the mounting sleeve 302. The mounting sleeve 302 and the inlet member 304 each include a hollow cylindrical body defining a longitudinally extending space, for example, sleeve passageway 306 and inlet passageway 308. The profile of the passageway 306, 308 may be any shape such as circular, oval, square, rectangular, or irregular. One end of the mounting sleeve 302 may be bolted to the gas outlet 288 of the body 282 of the plasma applicator 280 (partially shown) so that the sleeve passageway 306 in the mounting sleeve 302 is aligned with and coupled to the tube 284 at the gas outlet 288. Another end of the mounting sleeve 302 is connected to the inlet member 304 so that the inlet passageway 308 in the inlet member 304 is substantially aligned with the sleeve passageway 306 in the mounting sleeve 302. In certain examples, the diameter of the mounting sleeve 302 may be gradually reduced along the longitudinal axis of the mounting sleeve 302 to match the diameter of the inlet member 304. The mounting sleeve 302 and the inlet member 304 may be made of a material that does not cause recombination of the N* radicals. For example, the mounting sleeve 302 and the inlet member 304 may be made of silicon, silicon nitride, boron nitride, carbon nitride, sapphire or alumina ($Al_2O_3$). While the delivery pipe 300 is shown and described as two separate components (i.e., the mounting sleeve 302 and the inlet member 304) being connected to one another, the invention contemplates a delivery pipe formed from a single-piece integrated body with a passageway connecting to the inlet port 275 of the RTP chamber 201.

Figure 4:
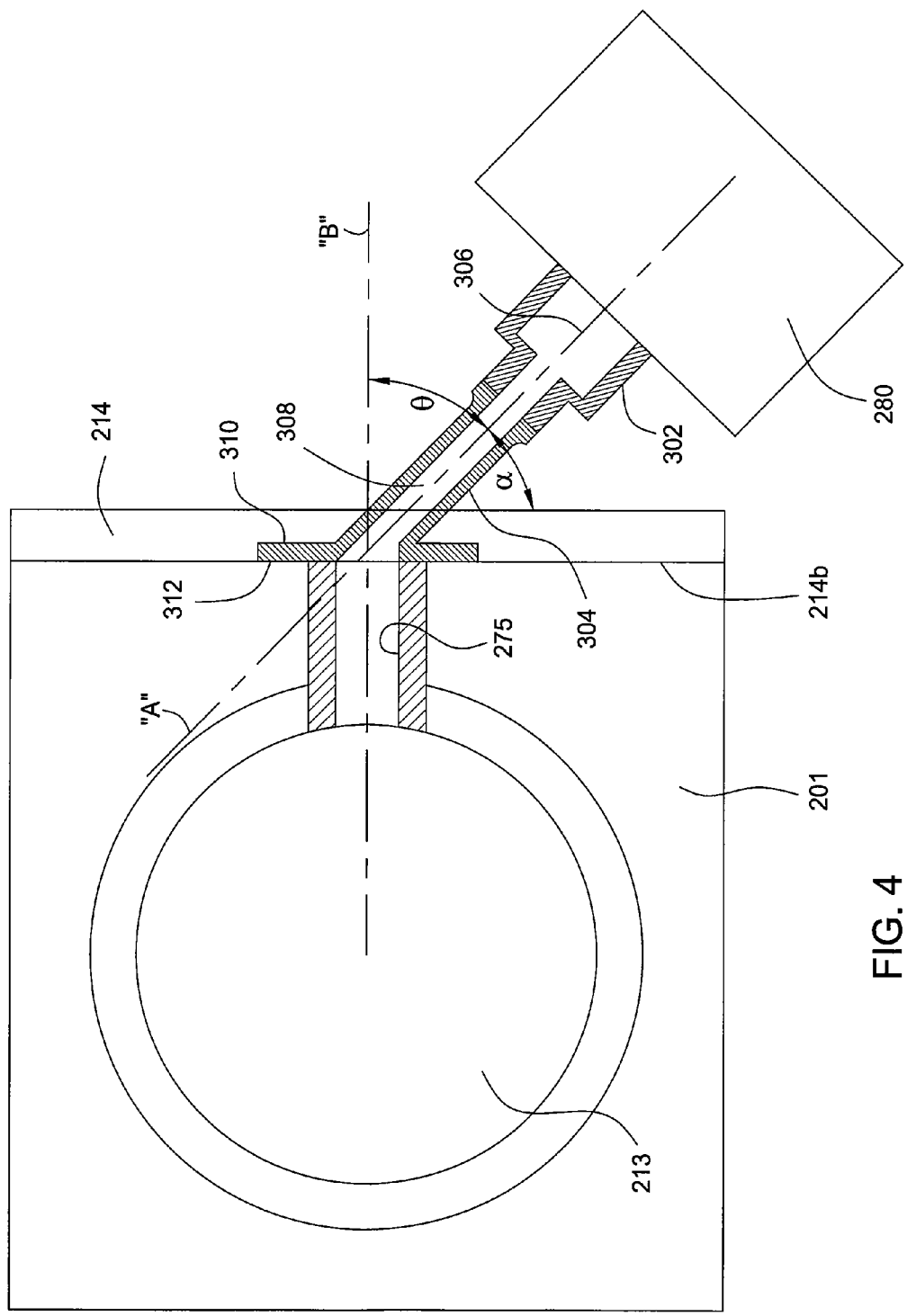
FIG. 4 illustrates a schematic and fragmentary top view of a delivery pipe of FIG. 3 and an RTP apparatus in accordance with an embodiment of the invention.

As can be better seen in FIG. 4, which illustrates a schematic and fragmentary top view of the delivery pipe 300 and the RTP chamber 201, the inlet member 304 may be configured as an adapter which is coupled to the inlet port 275 in the side wall 214 of the RTP chamber 201. It should be noted that some elements in FIG. 4 have been omitted and not drawn to scale for the purpose of simplicity and clarity of illustration. The inlet member 304 may include a flange 310 extending wholly around the outer surface of the inlet member 304. A portion of the inlet member 304 may be extended into the side wall 214 such that an outermost face 312 of the flange 310 is bolted to the interior surface 214b of the side wall 214. Alternatively, the outermost face 312 of the flange 310 may be bolted to the exterior surface 214a of the side wall 214 and configured in a way that the inlet passageway 308 is coupled to the inlet port 275. In either case, the delivery pipe 300 is coupled to the inlet port 275 in such a way that a longitudinal axis "A" of the inlet passageway 308 in the inlet member 304 intersect at an angle θ with respect to a longitudinal axis "B" of the inlet port 275. The flange 310 may extend in a direction at a desired angle "α" relative to the longitudinal axis "A" of the inlet passageway 308 as long as that the outermost face 312 of the flange 310 is substantially flush with interior surface 214b of the side wall 214.

In one embodiment, the angle "α" may range from about 20 degrees to about 80 degrees, such as about 45 degrees to about 70 degrees. The angle θ between the longitudinal axis "A" of the inlet passageway 308 and the longitudinal axis "B" of the inlet port 275 may range between about 10 degrees and about 70 degrees, such as about 20 degrees and about 45 degrees. In one example, the angle α is about 45 degrees or above, for example about 60 degrees. The angle α or θ should not be limited as defined herein and may vary as necessary. Having the delivery pipe 300 positioned at an angle relative to the inlet port 275 promotes collision of ions or reaction of ions with electrons or other charged particles since the ions lose their momentum through collisions when hitting the interior surface of the inlet port 275. Therefore, substantially all ions created by the excitation by the energy source are eliminated prior to entering the processing region 213. While the delivery pipe 300 is shown and described to include the flange 310, the flange 310 may be omitted as long as the delivery pipe 300 is coupled to the RTP chamber 201 at an angle that would promote collision of ions or reaction of ions with electrons or other charged particles.

In addition to the bent pipe structure as described herein, the delivery pipe 300 may be constructed of a length such that, for a given flow rate of a process gas (e.g., a given plasma generation rate), substantially all ions are extinguished or reacted with electrons or other charged particles to lose their excited state prior to existing the delivery pipe 300. The length of tube 284 and delivery pipe 300 necessary to extinguish substantially all the ions of a plasma at a given source gas flow rate may be determined experimentally or by lifetime calculations. In one embodiment, the tube 284 may have a length of about 5 inches to about 12 inches with an inside diameter of about 0.5 inches to about 2 inches. The length of the delivery pipe 300 (including passageways 306, 308) may vary from about 5 inches to about 25 inches, for example about 16 inches or above. The diameter of the passageway 306, 308 may be adjusted to optimize the pressure differential between the plasma applicator 280 and the processing region 213. In one embodiment, the diameter of the passageway 306, 308 is in a range between about 0.5 inches and about 2 inches, for example about 0.65 inches and about 1.5 inches in diameter. If desired, either one or both of the passageways 306, 308 may have a diameter gradually decreasing or increasing in the direction of flow to promote ion loss. In various embodiments, the total length of the tube 284 and the delivery pipe 300 may be between about 8 inches to about 35 inches, for example about 20 inches to about 35 inches. It is believed that a converging flow of plasma will promote ions collisions. The compression ratio, defined as cross sectional area of plasma generation area, (e.g., the tube 284) to cross sectional area of smallest diameter before the inlet port 275 (e.g., the inlet passageway 308) may be about 2 or above, for example between about 5 and about 10.

By separating the plasma generation area (i.e., plasma applicator 280) and the processing region 213 physically with an improved delivery pipe 300 being positioned at an angle relative to an inlet port 275 of the RTP apparatus that promotes recombination of ionic species, greater selectivity of nitridation of silicon or polysilicon floating gate 106 is obtained. In an embodiment where a NAND flash memory device having a floating gate 106 with silicon or polysilicon surface is treated with a selective nitridation process performed by the apparatus described herein, selectivity of nitridation of silicon or polysilicon floating gate 106 to STI region 108 may be increased to up to about 100:1 with a nitrogen dose of about $5\times10^{15}$ atoms/cm2 to about $15\times10^{15}$ atoms/$cm^2$, such as about $20\times10^{15}$ atoms/$cm^2$ or up, for example about $25\times10^{15}$ atoms/$cm^2$, in the surface of silicon or polysilicon floating gate 106.

Exemplary Pre-Clean Process for Gate Transistors

Prior to radical nitridation of the surface of the floating gate 106 to form the nitride layer (i.e., the dielectric layer 113, FIG. 1), a pre-clean process may be performed to remove native oxides or contaminants from the surface of the floating gate 106 to provide a cleaned surface for incorporation of radicals (e.g., nitrogen radicals). A cleaned surface is believed to improve the radical dose profile. In certain embodiments, the pre-clean process may be performed before and/or after the radical nitridation process.

Figure 5:
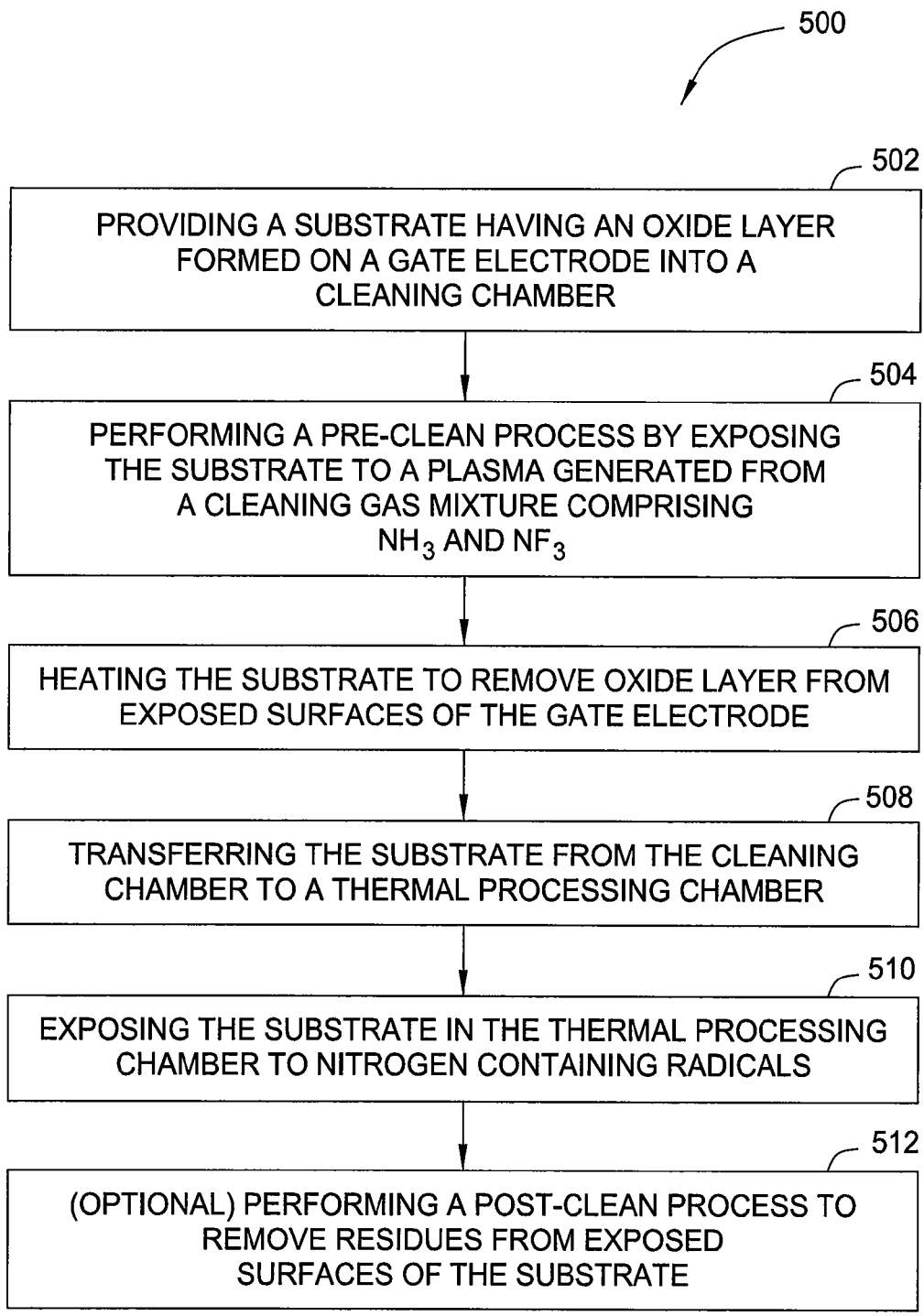
FIG. 5 illustrates a method of fabricating a NAND flash memory device according to one embodiment of the present invention.
Figure 6:
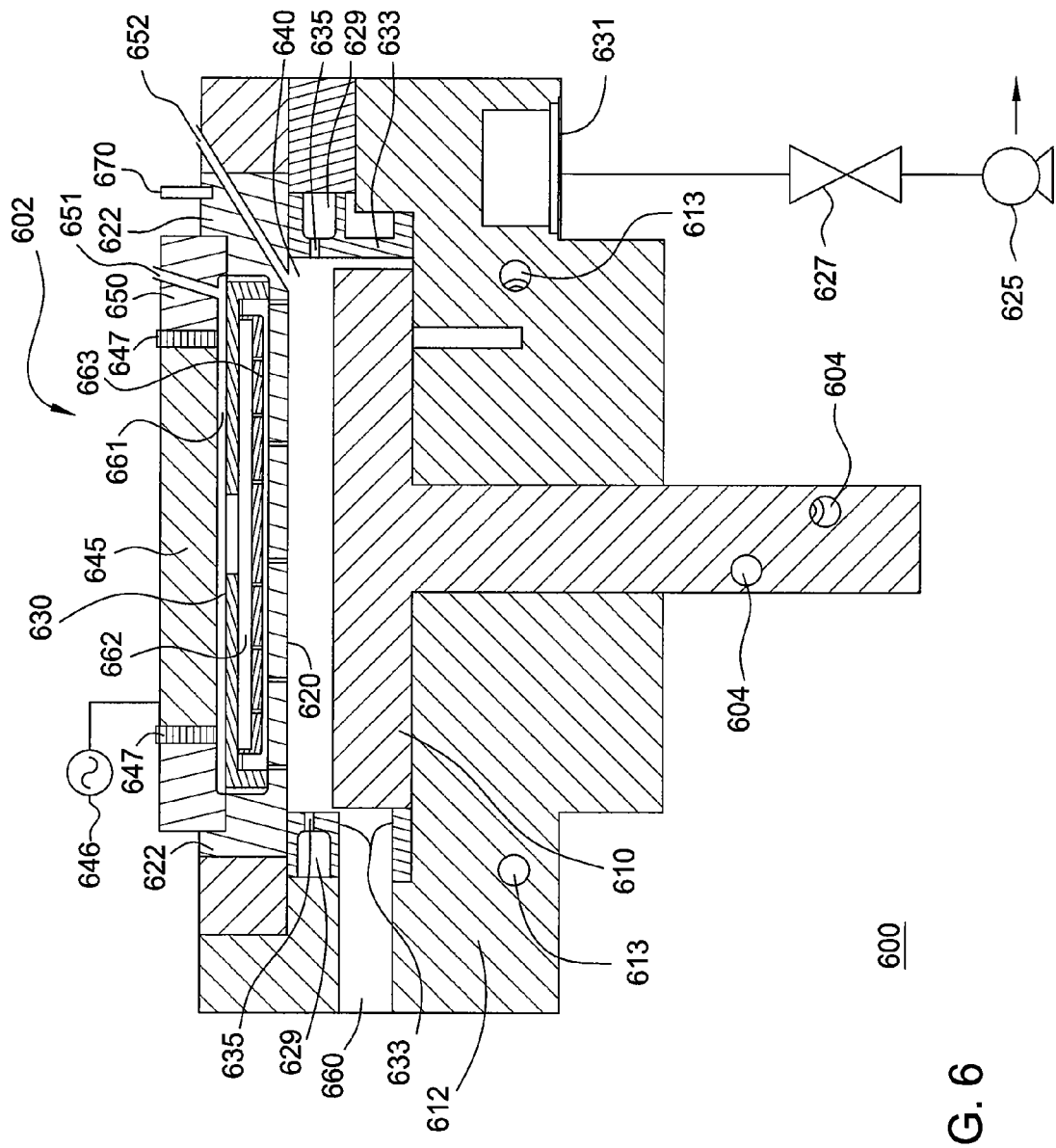
FIG. 6 illustrates a cross-sectional view of a processing chamber for performing a pre-clean process according to embodiments of the present invention.
Figure 7:
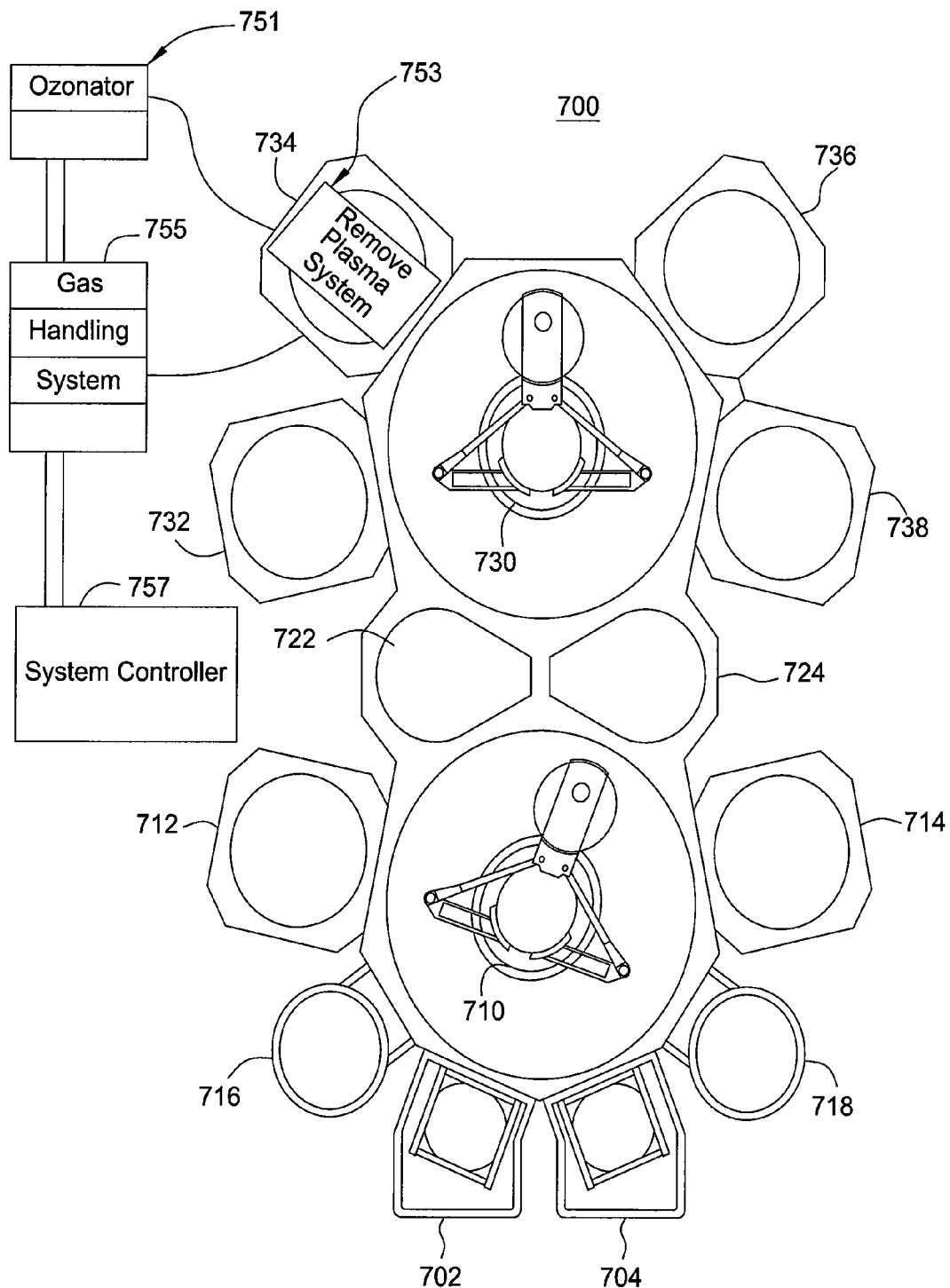
FIG. 7 illustrates a schematic top-view of an exemplary multi-processing platform according to embodiments of the present invention.

FIG. 5 depicts a method 500 of fabricating a NAND flash memory device 100 according to one embodiment of the present invention. The method 500 generally includes a pre-clean process used to clean exposed surfaces of the floating gate 106, followed by a radical nitridation process to incorporate nitrogen into cleaned, exposed surfaces of the floating gate 106, with little or no formation of the dielectric layer 113 on the STI region 108 or any other dielectric films. The pre-clean process may be performed in a processing chamber, for example, a cleaning chamber 600 as shown in FIG. 6. An exemplary cleaning chamber is more fully described in co-pending U.S. patent application Ser. No. 12/646,030, entitled "SMOOTH SICONI ETCH FOR SILICON-CONTAINING FILMS," filed Dec. 23, 2009, which is incorporated herein by reference to the extent not inconsistent with the invention. The radical nitridation process may be performed a thermal processing chamber, for example, the rapid thermal processing (RTP) chamber 201 as depicted in FIG. 2. The cleaning chamber 600 and the RTP chamber 201 may be integrated into a variety of multi-processing platforms such as, for example, the Producer® GT, Radiance Centura®, Vantage®, or Endura® that are commercially available from Applied Materials Inc. An exemplary multi-processing platform 700 which may include the cleaning chamber 600 and the RTP chamber 201 is illustrated in FIG. 7. The multi-processing platform 700 is capable of performing several processing processes without breaking vacuum. The multi-processing platform 700 may include a first set of one or more substrate processing chambers 712, 714, 716, 718, a second set of one or more substrate processing chambers 732, 734, 736, 738, one or more load lock chambers 702, 704 for transferring of substrates into and out of the platform 700, one or more transfer chambers 722, 724, and a first and second robots 710, 730 configured to transfer the substrates between the transfer chambers 722, 724 and the first and second set of one or more processing chambers. The exemplary multi-processing platform 700 is more fully described in the co-pending U.S. patent application Ser. No. 12/646,030 mentioned above.

In one embodiment, the substrate processing chambers 732 and 734 may be a thermal processing chamber, for example, the rapid thermal processing (RTP) chamber 201 as depicted in FIG. 2 and a cleaning chamber 600 as depicted in FIG. 6, respectively. In certain embodiments, the multi-processing platform 700 may be configured to provide multiple chamber pairs including a cleaning chamber similar to the cleaning chamber 600 and a thermal processing chamber similar to the RTP chamber 201 to improve throughput. It is contemplated that the first and second set of one or more processing chambers may be outfitted to perform a variety of substrate processing processes including, for example, the dry etch clean process and the radical nitridation process described herein, cyclical layer deposition (CLD), atomic layer deposition (ALD), chemical vapor deposition (CVD), physical vapor deposition (PVD), degas, or orientation.

The method 500 generally begins at 502 by providing a partially fabricated NAND flash memory device having an oxide layer formed on a floating gate to a cleaning chamber 600 (e.g., the processing chamber 734 in FIG. 7). The term "partially fabricated" NAND flash memory device herein refers to a fabricating stage before an optional dielectric layer 113 is formed on exposed surfaces of a floating gate 106 (see FIG. 1). The floating gate 106 may be deposited atop a tunnel oxide layer 104. A shallow trench isolation (STI) region 108 may be disposed adjacent to the tunnel oxide layer 104 and the floating gate 106. Other fabrication steps to provide the partially fabricated memory device may include deposition of an isolation material, such as $SiO_2$, in the STI region 108, planarizing the isolation material level with an upper surface of the floating gate 106, and etching the isolation material down to a desired level to result in a substrate having the floating gate 106, as discussed previously with respect to FIG. 1. The floating gate 106 may comprise a conductive material, such as silicon, polysilicon, metals, or the like.

The cleaning chamber 600 may be configured to perform a dry clean process such as a plasma-assisted etching process. In one embodiment, the cleaning chamber 600 is configured to perform a SiCoNi™ etch process on the substrate to remove native oxides from the surface of the partially fabricated NAND flash memory device having the floating gate. Alternatively, the cleaning chamber may be configured to perform a wet clean process, for example, a buffered oxide etch (BOE) process, a SC1 process (using a solution containing ammonium hydroxide and hydrogen peroxide held at elevated temperature), a SC2 process (using a solution containing hydrochloric acid and hydrogen peroxide held at elevated temperature), or a HF-last process (using a solution containing water, HF and optional additives including chelators, surfactants, reductants, other acids or combinations thereof) to remove native oxides from exposed surfaces of the floating gate 106.

At box 504, a pre-clean process is performed to clean the exposed surfaces of the floating gate 106. In one embodiment where the cleaning chamber 600 is configured to perform the SiCoNi™ etch process, the exposed surfaces of the partially fabricated NAND flash memory device 100 having the floating gate 106 is exposed to a plasma generated from a cleaning gas mixture comprising a hydrogen-containing gas and a fluorine-containing gas. In one embodiment, the cleaning gas mixture may include a hydrogen-containing gas without using a fluorine-containing gas. In one example, the cleaning gas mixture comprises ammonia ($NH_3$) and nitrogen trifluoride ($NF_3$) gases. The cleaning gas mixture may be activated into a plasma by exposure to an excitation energy such as microwave, UV, RF, intense heat, or electron synchrotron radiation in a remote plasma region separate from a processing region of the cleaning chamber where the partially fabricated NAND flash memory device 100 is disposed. The excitation energy dissociates the ammonia and nitrogen trifluoride gases into reactive species that combine to form a highly reactive ammonia fluoride ($NH_4F$) compound and/or ammonium hydrogen fluoride ($NH_4F.HF$) in the gas phase. The plasma species is then introduced into the processing region of the cleaning chamber to interact with the exposed surfaces of the floating gate 106 (see FIG. 1) to form ammonium hexafluorosilicate ($(NH_4)_2SiF_6$), $NH_3$, and $H_2O$ products. The $NH_3$ and $H_2O$ are vapors and may be removed from the processing region by a vacuum pump attached to the cleaning chamber. A thin layer of $(NH_4)_2SiF_6$ by-products is left behind on the exposed surface of the floating gate 106. While not discussed herein, it is contemplated that the plasma may be generated in-situ within the processing region of the cleaning chamber.

The flow of ammonia and nitrogen trifluoride introduced into the remote plasma region is variable and may be adjusted to accommodate, for example, the thickness of the oxide layer to be removed, the geometry of the substrate being cleaned, the volume capacity of the plasma, the volume capacity of the cleaning chamber, etc. The flows of ammonia and nitrogen trifluoride are controlled such that the hydrogen-to-fluorine atomic flow ratio is maintained at about 1:1, about 1:2, about 1:4, about 5:1, about 10:1, about 20:1 or greater, for example, about 30:1 in different embodiments. The pressure in the remote plasma region may be controlled between about 0.1 Torr and 50 Torr, for example between about 2 Torr to about 20 Torr, such as between about 5 Torr to 10 Torr. During the pre-clean process, the temperature of the memory device 100 may be maintained between about 20° C. to about 100° C., for example between about 50° C. and about 85° C.

At box 506, the partially fabricated NAND flash memory device 100 is heated to a temperature of about 75° C. to about 250° C., for example between about 100° C. and 150° C., such as about 130° C., to sublimate the thin layer of $(NH_4)_2SiF_6$ into volatile $SiF_4$, $NH_3$, and HF products. The memory device 100 may be heated by, for example, heating at least a portion of the substrate support with a resistive heater, heating the gas delivery plate (used to introduce plasma species) facing the substrate support, reducing the distance between the substrate support and the heated gas delivery plate, or any suitable heating approach. These volatile products are then removed from the chamber using the vacuum pump. The SiCoNi™ etch process performed in the cleaning chamber 600 thus removes essentially the oxide layer or all native oxides from exposed surfaces of the floating gate 106, providing a receptive surface for incorporation of nitrogen radicals to be performed in the subsequent step.

At box 508, once the exposed surfaces of the floating gate 106 have been cleaned, the memory device 100 may be transferred by the second robot 730 from the cleaning chamber 600 (e.g., the processing chamber 734) to the RTP chamber 201 (e.g., the processing chamber 732) without breaking vacuum. Particularly, the exposed surfaces of the floating gate 106 are not exposed to air (oxygen-free environment) during the transfer so as to avoid native oxides or contaminants formed on the exposed surfaces of the floating gate 106. The time for transferring the memory device 100 from cleaning chamber 600 (e.g., the processing chamber 734) to the RTP chamber 201 (e.g., the processing chamber 732) may be less than about 10 minutes, for example less than about 6 minutes, for example between about 30 seconds and about 3 minutes. The transferring time may vary depending upon the process scheme, as long as the memory device gets enough time to cool down to a temperature range suitable for the subsequent plasma nitridation process and/or the hydrogen and fluorine terminated surface of the floating gate 106 remain effective for the subsequent plasma nitridation process.

At box 510, the cleaned, exposed surfaces (e.g., the field surface 114 and sidewall 115) of the floating gate 106 disposed in the RTP chamber 201 (e.g., the processing chamber 732) are exposed to nitrogen containing radicals. In one embodiment, the exposed surfaces of the floating gate 106 may be exposed to energetically and vibrationally excited neutral species. In another embodiment, the exposed surfaces of the floating gate 106 may be exposed to nitrogen containing radicals and energetically and vibrationally excited neutral species. In either case, the exposure of the floating gate 106 to nitrogen containing radicals and/or energetically excited neutral species may be performed using a selective plasma nitridation process, as discussed previously with respect to FIG. 1. The selective plasma nitridation process conformally forms a dielectric layer 113, such as a nitride layer, on the exposed surfaces of the floating gate 106. The nitrogen containing radicals may be flowed from a remote plasma generator (not shown in FIG. 7), via a delivery pipe (not shown), to the RTP chamber 201 (e.g., the processing chamber 732). The delivery pipe may be positioned at an angle relative to an inlet port of the RTP chamber 201 to promote recombination of ionic species, as discussed above with respect to FIGS. 3 and 4. The nitrogen containing radicals will react preferentially with the surface of the floating gate 106 (formed of silicon or polysilicon, for example) during the selective plasma nitridation process, rather than the surface of the STI region 108 (formed of silicon oxide, for example) due to the fact that radicals are not reactive enough to break Si—O bond. Accordingly, the selective plasma nitridation process forms nitrides of silicon faster than nitrides of silicon oxide, resulting in a significantly greater concentration of nitrogen-containing material, i.e., dielectric layer 113 formed of, for example, Si—N bonds, at the field surface 114 and sidewall 115 of the floating gate 106 as opposed to STI region 108 between the adjacent floating gates 106.

At box 512, an optional post-clean process may be optionally performed to remove any residues from the exposed surfaces of the formed dielectric layer 113. The post-clean process may be similar to the pre-clean process as described in box 502 to box 506.

Thus, embodiments of the present invention provide a method and an apparatus for removing native oxides from a substrate prior to a plasma nitridation process. The method and apparatus advantageously removing the native oxides from exposed surfaces of the substrate while providing a cleaned surface for incorporation of nitrogen radicals by performing a pre-cleaning process (e.g., a SiCoNi™ etch process), a plasma nitridation process, and an optional post-cleaning process. Particularly, the substrate is transferred from a cleaning chamber performing the pre-cleaning process and a thermal processing chamber performing the plasma nitridation process within a multi-processing platform without breaking vacuum, thereby improving the overall electrical device performance.

While the foregoing is directed to embodiments of the present invention, other and further embodiments of the invention may be devised without departing from the basic scope thereof, and the scope thereof is determined by the claims that follow.

The invention claimed is:

1. A method for removing native oxides from a substrate, comprising:
    transferring a substrate having an oxide layer formed thereon into a processing chamber;
    exposing the substrate to a plasma generated from a cleaning gas mixture to remove the oxide layer from the substrate, wherein the cleaning gas mixture comprises a hydrogen-containing gas;
    exposing the substrate to a plasma containing substantially nitrogen-containing radicals or energetically and vibrationally excited nitrogen-containing neutral species to form a nitride layer on the substrate;
    exposing the nitride layer to a plasma generated from a gas mixture comprising an ammonia ($NH_3$) gas and a nitrogen trifluoride ($NF_3$) gas; and
    heating the substrate.

2. The method of claim 1, wherein the nitride layer is formed by exposing the substrate to the plasma containing substantially nitrogen-containing radicals and energetically and vibrationally excited nitrogen-containing neutral species.

3. A method for removing native oxides from a substrate, comprising:
    transferring a substrate having an oxide layer disposed thereon into a first processing chamber;
    exposing the substrate to a plasma generated from a cleaning gas mixture, wherein the cleaning gas mixture comprises a hydrogen-containing gas;
    heating the substrate to a temperature sufficient to remove the oxide layer from the substrate;
    transferring the substrate from the first processing chamber to a second processing chamber without breaking vacuum;
    flowing a plasma containing substantially nitrogen-containing radicals into the second processing chamber to expose the substrate to nitrogen containing radicals to form a nitride layer on the substrate;
    exposing the nitride layer to a plasma generated from a gas mixture comprising an ammonia ($NH_3$) gas and a nitrogen trifluoride ($NF_3$) gas; and
    heating the substrate.

4. The method of claim 3, wherein the oxide layer is formed on a gate electrode, or a source or a drain region presented in the substrate.

5. The method of claim 3, wherein the hydrogen-containing gas comprises an ammonia ($NH_3$) gas.

6. The method of claim 3, wherein the cleaning gas mixture further comprises a fluorine-containing gas.

7. The method of claim 6, wherein the fluorine-containing gas comprises a nitrogen trifluoride ($NF_3$) gas.

8. The method of claim 7, wherein the plasma from a cleaning gas mixture is generated in a remote plasma region separate from a processing region where the substrate is disposed.

9. The method of claim 8, wherein the hydrogen-containing gas and fluorine-containing gas are flowed into the remote plasma region at a hydrogen-to-fluorine atomic flow ratio between about 1:1 and about 5:1 or between about 10:1 and about 30:1.

10. The method of claim 3, wherein the nitrogen-containing radicals comprise N radicals, NO radicals, NH radicals, $NH_2$ radicals, or $NH_3$ radicals.

11. The method of claim 3, wherein flowing the plasma containing substantially nitrogen-containing radicals into the second processing chamber comprises:
   flowing the plasma comprising nitrogen-containing radicals from a remote plasma applicator into a delivery member having a longitudinal passageway, wherein the delivery member is disposed between the remote plasma applicator and the second processing chamber; and
   flowing the plasma comprising nitrogen-containing radicals from the passageway to an inlet port formed in a sidewall of the second processing chamber, wherein the plasma are flowed at an angle into the inlet port to promote collision of ions or reaction of ions with electrons or charged particles in the plasma such that ions are substantially eliminated from the plasma before entering the second processing chamber.

12. The method of claim 11, wherein the delivery member is configured such that a longitudinal axis of the passageway intersects at an angle of about 20 degrees to about 80 degrees with respect to a longitudinal axis of the inlet port.

13. A method for removing native oxide from a substrate, comprising:
   transferring a substrate having an oxide layer disposed thereon into a first processing chamber;
   exposing the oxide layer to a plasma generated from a cleaning gas mixture, wherein the cleaning gas mixture comprises an ammonia ($NH_3$) gas and a nitrogen trifluoride ($NF_3$) gas;
   heating the substrate to a temperature sufficient to remove the oxide layer from the substrate;
   exposing the substrate to a plasma containing substantially nitrogen-containing radicals to form a nitride layer on the exposed surface of the substrate;
   exposing the nitride layer to a plasma generated from a gas mixture comprising an ammonia ($NH_3$) gas and a nitrogen trifluoride ($NF_3$) gas; and
   heating the substrate.

14. The method of claim 13, further comprising:
   before the nitride layer is formed on the exposed surface of the substrate, transferring the substrate from the first processing chamber to a second processing chamber without breaking vacuum.

15. The method of claim 13, wherein the plasma from a cleaning gas mixture is generated in a remote plasma region separate from a processing region where the substrate is disposed.

16. The method of claim 13, wherein the nitrogen-containing radicals are generated from a remote plasma applicator, the remote plasma applicator being connected to a processing region of the second processing chamber through a delivery member having a longitudinal passageway.

17. The method of claim 16, further comprising:
   flowing the plasma containing substantially nitrogen-containing radicals from the passageway to an inlet port formed in a sidewall of the second processing chamber, wherein the plasma are flowed at an angle into the inlet port to promote collision of ions or reaction of ions with electrons or charged particles in the plasma such that ions are substantially eliminated from the plasma before entering the processing region of the processing chamber.

18. The method of claim 17, wherein the delivery member is configured such that a longitudinal axis of the passageway intersects at an angle of about 20 degrees to about 80 degrees with respect to a longitudinal axis of the inlet port.

19. The method of claim 18, wherein the passageway has a length between about 5 inches and about 25 inches.

20. A method for processing a substrate, comprising:
   exposing a substrate having an oxide layer formed thereon to a plasma generated from a cleaning gas mixture to remove the oxide layer from the substrate, wherein the cleaning gas mixture comprises a hydrogen-containing gas and wherein the plasma is generated in a remote plasma region separate from a processing region where the substrate is disposed;
   exposing the substrate to a plasma containing substantially nitrogen-containing radicals or energetically and vibrationally excited nitrogen-containing neutral species to form a nitride layer on the substrate;
   exposing the nitride layer to a plasma generated from a gas mixture comprising an ammonia ($NH_3$) gas and a nitrogen trifluoride ($NF_3$) gas; and
   heating the substrate.

* * * * *

UNITED STATES PATENT AND TRADEMARK OFFICE
CERTIFICATE OF CORRECTION

PATENT NO. : 8,808,564 B2  
APPLICATION NO. : 13/672469  
DATED : August 19, 2014  
INVENTOR(S) : Rogers et al.

Page 1 of 1

It is certified that error appears in the above-identified patent and that said Letters Patent is hereby corrected as shown below:

In the Specification,

Column 3, Line 32, please delete "Endure®" and insert --Endura®-- therefor.

Signed and Sealed this  
Twenty-third Day of December, 2014

Michelle K. Lee  
*Deputy Director of the United States Patent and Trademark Office*